United States Patent [19]

Senderowicz et al.

[11] Patent Number: 5,001,725
[45] Date of Patent: Mar. 19, 1991

[54] DIFFERENTIAL SWITCHED-CAPACITOR SIGMA-DELTA MODULATOR

[75] Inventors: Daniel Senderowicz, Berkeley; Nan-Sheng Lin, Albany, both of Calif.

[73] Assignee: Teknekron Communications Systems, Inc., Berkeley, Calif.

[21] Appl. No.: 354,654

[22] Filed: May 19, 1989

[51] Int. Cl.$^5$ ............................................. H04B 14/06
[52] U.S. Cl. ..................................... 375/28; 341/143
[58] Field of Search ................. 375/28; 341/143–144, 341/122, 155; 307/155

[56] References Cited

U.S. PATENT DOCUMENTS

| | | | |
|---|---|---|---|
| 4,588,981 | 5/1986 | Senn | 341/143 |
| 4,733,219 | 3/1988 | Reusens et al. | 341/50 |
| 4,851,841 | 7/1989 | Sooch | 375/28 X |
| 4,896,156 | 1/1990 | Garverick | 375/28 X |

Primary Examiner—Benedict V. Safourek
Assistant Examiner—Tesfaldet Bocure
Attorney, Agent, or Firm—Limbach, Limbach & Sutton

[57] ABSTRACT

A fully differential sigma-delta signal processor for use in high-speed voiceband or higher-frequency applications. The processor receives the two polarities of a differential input signal and passes them to a differential-amplifier integrator through a switched sampling capacitor arrangement. The capacitors are each alternately and concurrently switched back and forth between the two signal paths for the two polarities of the input signal responsive to a clock signal in such a manner as to sample and integrate the input signal at an effective signal transfer rate of at least twice the clock frequency. An analog-to-digital converter defines a digital feedback-control signal characteristic of the integrator output signal. A second switched-capacitor arrangement selectively applies a feedback signal to the integrator inputs, responsive to the digital control signal, at a switching rate comparable to the effective signal transfer rate through the integrator.

10 Claims, 2 Drawing Sheets

5,001,725

DIFFERENTIAL SWITCHED-CAPACITOR SIGMA-DELTA MODULATOR

BACKGROUND OF THE INVENTION

The present invention relates generally to, signal processing and is more particularly directed to a sigma-delta modulator for use in voiceband, audioband, or higher-frequency signal processing.

Sigma-delta signal processing techniques are useful for data encoding in modem and other higher-frequency applications where they promise high-resolution and high-linearity data conversion. In addition to high resolution and high linearity, they are desirable in part because they are readily implemented with MOS integrated circuit technology. Other important advantages are that a sigma-delta system consists largely of digital circuitry and can therefore be scaled efficiently in area as MOS feature sizes shrink and that the analog components used are more tolerant of component mismatches normally associated with digital MOS technologies.

However, as the signal bandwidth to be processed increases, greater demand is placed on the performance of the components to the point where impairments in the analog components become significant in preventing the sigma-delta processor from achieving its theoretical performance limit.

In known sigma-delta systems a balance must be struck between sampling the desired signal at a slower rate, resulting in either limited frequency range of operation or limited oversampling ratio and consequently lower achievable signal-to-quantization noise, or accepting a higher noise level due to inadequate settling of the analog operational amplifier components of the system.

SUMMARY OF THE INVENTION

The present invention provides a fully differential sigma-delta signal processing modulator for use in high-speed voiceband or higher-frequency applications, which overcomes to a great extent the above-mentioned tradeoff. The modulator uses a switched capacitor circuit for the sampling and integrating mechanism and for a decision-dependant feedback mechanism, which reduces operational amplifier settling time requirements by one-half. As a result, the invention provides for improved signal-to-noise ratio and overall performance, especially for those applications where higher sampling frequencies are needed.

Briefly, a signal processor according to the invention receives the two polarities of a differential input signal and passes them to a differential-amplifier integrator through a switched sampling capacitor arrangement. That arrangement includes first and second sampling capacitors and a controllable switch means responsive to a first control signal for alternately switching the sampling capacitors into opposite signal paths between associated input nodes and amplifier inputs. The switch means in effect defines two switch states. In the first state, each of the sampling capacitors is interposed between a respective input node receiving one of the input signal polarities and a corresponding side of the differential-amplifier integrator. In the second state, the sampling capacitors are interposed between the opposite input nodes and corresponding amplifier sides. Switched in this manner responsive to a cyclical clock signal or other control signal, the sampling capacitors are alternately switched into the two signal paths for the two sides of the differential input signal. The processor also includes a logical decision means responsive to the output signal from the integrator for providing a second control signal having a predetermined number of bits characterizing the output signal. For example, with a one-bit control signal the one bit may be taken to indicate the polarity of the integrator output signal. A digital-to-analog converter converts the second control signal to an analog signal, which is applied in negative feedback relation to the amplifier inputs. The converter comprises a plurality of sampling capacitors for providing charges corresponding to a multi-level feedback signal to the integrator, where the number of levels corresponds to the number of states of the second control signal characterizing the integrator output signal. A plurality of controllable switch assemblies are used to select the desired feedback level, to apply the selected level to the appropriate integrator input, and to refresh the integrator input level with a bias voltage. The switch assemblies are responsive to the first control signal for alternately switching pairs of feedback sampling capacitors to effect the appropriate charge transfer and are responsive to the second control signal for selecting the desired charge level and applying it to the desired integrator input.

For charge corresponding to the feedback levels to be transferred at the same rate as the sampling of the input signal, two sets of interleaved feedback sampling capacitors are employed in the switch assemblies. The switch assemblies alternately connect the capacitors between reference voltages on one plate and between a bias voltage and the appropriate integrater input on the other plate.

Arranged in this manner, the modulator according to the invention is able to effectively double the system sampling rate for the same op amp settling time or, alternatively, effectively double the op amp settling time for the same sampling rate.

Other aspects, advantages and novel features of the invention are described below or will be readily apparent to those skilled in the art from the following specifications and drawings of illustrative embodiments.

DETAILED DESCRIPTION OF ILLUSTRATIVE EMBODIMENTS

Figure 1:
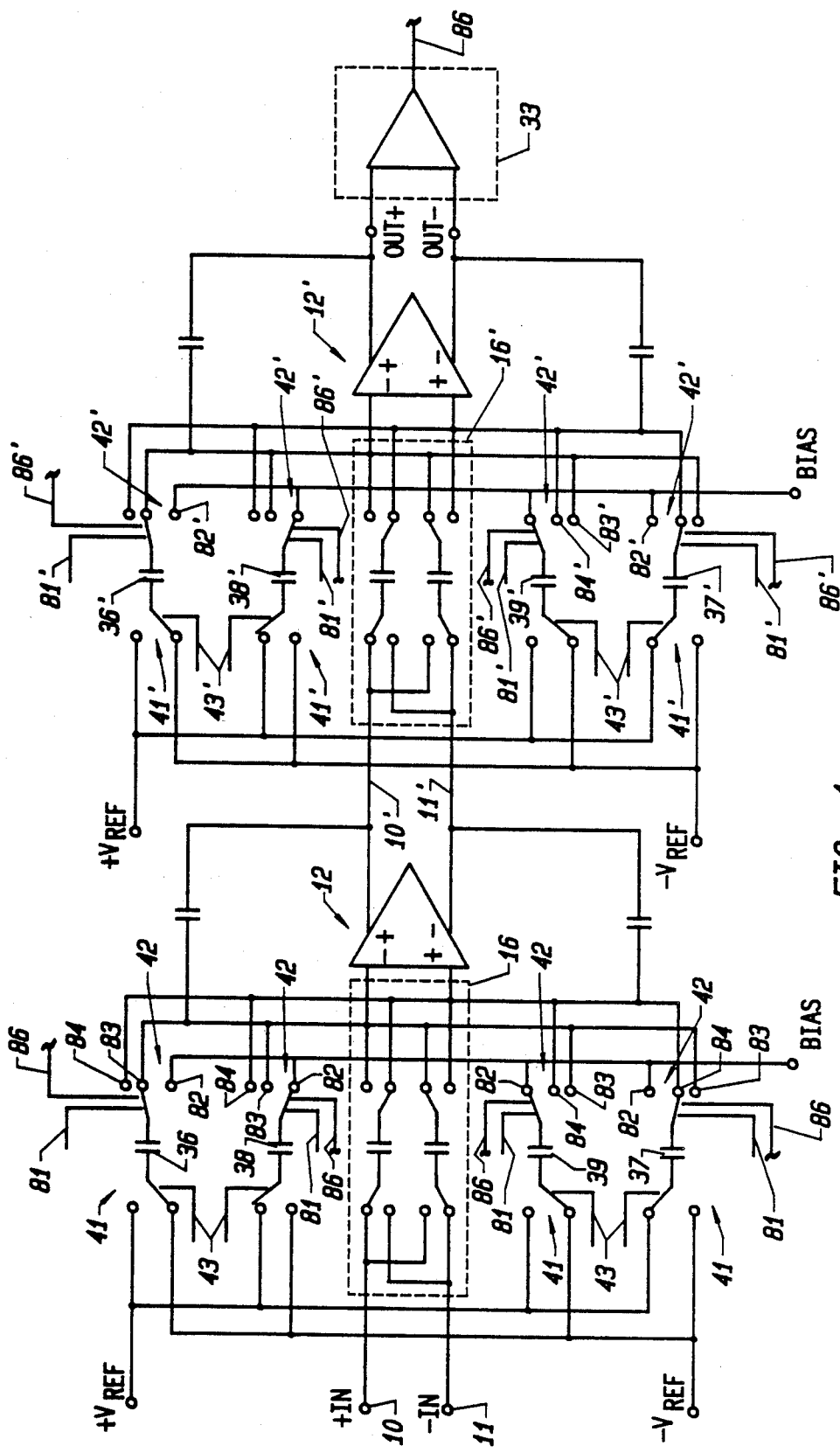
FIG. 1 is a schematic diagram of a fully-differential switched-capacitor modulator with decision-directed feedback according to the present invention.

For the sake of illustration, the invention is shown in FIG. 1 in a second-order sigma-delta modulator. Those skilled in the art will appreciate from the present disclosure that the invention may also be implemented in sigma-delta processors of other orders.

With reference to FIG. 1, like components of the first and second stages of the second-order modulator are numbered by like reference numerals with the second-stage reference numerals being primed. The modulator includes first and second input nodes 10 and 11 for receiving the two polarities of a differential input signal and an active differential integrator, indicated generally at 12, having inputs 13 and 14. Interposed between the input nodes and the integrator inputs is an arrangement of sampling capacitors and a controllable switch assembly for coupling the sampling capacitors into the respective signal paths. The sampling-capacitor-switch arrangement is shown schematically in the dashed block 16, which is shown in greater detail in FIG. 2. The sampling capacitors 17 and 18 sample the differential input. The switch assembly is composed of the individual switches, indicated by the reference numerals 19-22, As will become apparent below, the integrator inputs 13 and 14 are associated with the input nodes 10 and 11, respectively, so that the two polarities of the input signal are always coupled through the switching arrangement to the same sides of the integrator.

The active differential integrating circuit 12 is of conventional design and a detailed exposition of its construction is unnecessary here. For purposes of illustration the integrating circuit 12 is shown here comprising operational amplifier 23, which has inverting and non-inverting inputs 14 and 13 and corresponding outputs 26 and 27, and integrating capacitors 28 and 29 arranged in feedback relation to the op amp 23.

Figure 2:
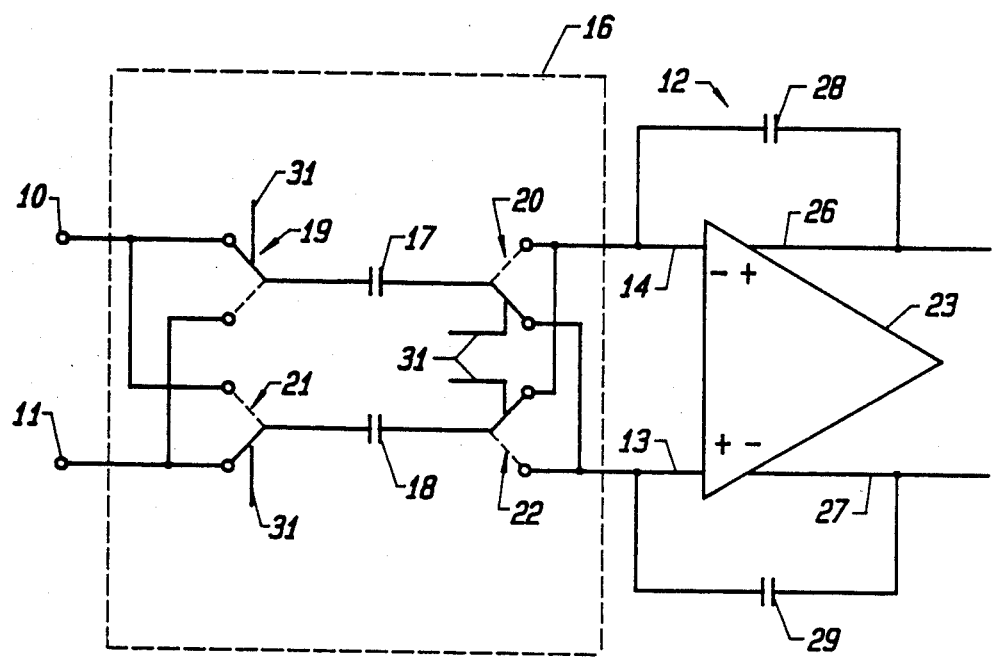
FIG. 2 is a schematic diagram of a switch assembly for switching capacitors for use with the invention.

The switch arrangement 16 of FIGS. 1 and 2 defines two alternative signal paths between the input node 10 and the amplifier input 14 and two alternative signal paths between the input node 11 and amplifier input 13. The assembly of switches 19-22 has two switch states. In the first switch state, shown in solid lines in FIGS. 1 and 2. sampling capacitor 17 is coupled between input node 10 and amplifier input 13, and sampling capacitor 18 is coupled between input node 11 and amplifier input 14. In the second switch state, shown in phantom in FIGS. 1 and 2, the dispositions of the sampling capacitors are reversed. Sampling capacitor 18 is coupled between input node 10 and amplifier input 13, and sampling capacitor 17 is coupled between input node 11 and amplifier input 14.

Figure 3:
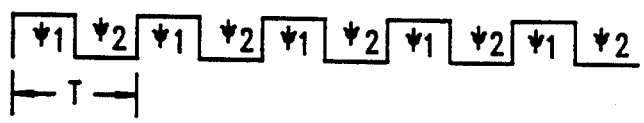
FIG. 3 is a clock signal, delineating the two clock phases, for controlling the switch assemblies.

The switches are switchable between the two states responsive to a control signal applied at reference numeral 31. In practice, the switches are switched between the states responsive to a clock signal, such as illustrated in FIG. 3, which may be provided by the system clock or by another clock signal of characteristic frequency selected especially for controlling the modulator.

The modulator of FIG. 1 also includes an analog-to-digital converter (A/D) 33 for providing a second, digital control signal, which is used for defining a decision-dependant analog feedback signal. In a first-order modulator, the A/D converter 33 converts the analog output signal of the integrator 12 to a characteristic digital signal. In the second-order modulator configuration of FIG. 1, the A/D converter 33 receives the output signal from the integrator 12' of the second modulator stage and generates the digital feedback control signal, which is applied to both stages.

The characteristic digital signal from the converter 33 has a predetermined number of bits, which characterize the applied analog signal from the preceding integrator. For example, for a one-bit signal the bit value may be defined to indicate the polarity of the applied integrator output signal. Alternatively, the digital signal may be provided by a two or three-bit signal, or in general by a relatively small predetermined number of bits, indicating the approximate level of the output signal. In effect, the digital signal from the A/D converter 33 represents a coarse-grained decision as to the magnitude or some other parameter associated with the output signal. Since A/D converters are of conventional construction, a detailed exposition is the converter 33 is not necessary here.

Referring again to FIG. 1, the modulator includes an assembly of sampling capacitors 36-39 for sampling a two-level reference voltage having values +Vref and −Vref. As will be explained more fully below, the reference voltages are sampled in response to the control signal from the A/D converter 33 which represents a one-bit decision as to the polarity of the second-stage integrator output signal. If the converter 33 is configured to provide a multi-bit control signal, then means to provide charges corresponding to a multi-level feedback signal should be employed, and the various values of the multi-level feedback signal are selected according to the particular bit value of the control signal. For example, multiple capacitors may be employed which have capacitance values chosen to accumulate charge in amounts determining the desired feedback values.

A second controllable switch assembly is provided by the switches 41 and 42. As explained more fully below, in response to the first control signal applied at 43, this assembly alternately couples the capacitors 36-39 to voltage sources of preset levels to accumulate the necessary charge on the capacitors for generating the feedback signal. In response to the second control signal from the converter 33. predetermined combinations of the capacitors 36-39 are selected and the charge accumulated on the selected capacitors is transferred to a selected amplifier input.

It should now be apparent that the combination of capacitors 36-39 and switches 41, 42 functions as a D/A converter for converting the second control signal from the A/D converter 33 to an analog signal which is applied in negative feedback relation to the amplifier.

The operation of the present invention, and the manner in which it achieves its faster performance, depends on the switching techniques used for sampling the input signal and for selecting the proper decision-dependant reference level. These will be better understood by a comparison with conventional switched-capacitor filter operation.

In the present invention as well as in known filters, the input analog signal is sampled by accumulating charge on a sampling capacitor in an amount related to the signal level. After a prescribed sampling time the accumulated charge is transferred from the capacitor to an integrating circuit, which provides an integrated signal level for use in subsequent processing. In switched-capacitor filters the accumulated charge is transferred by alternately switching the sampling capacitor between the input analog signal and the integrating circuit. In a common switched-capacitor arrangement, the sampling and integration operations are performed once every clock period. Each clock period is partitioned into two phases, one used to sample the input to the sampling capacitor while the other is used to transfer the charge on the sampling capacitor to the integrating capacitor. Thus, the op amp has available one phase or one-half of a clock period, to settle its output voltage so that the charge on the sampling capacitor can be fully transferred to the integrating capacitor. Therefore the rate at which the input analog signal is sampled is constrained by the time provided for the op amp to settle, which is referred to herein as the characteristic op amp settling time. With known switched-capacitor filters only one-half of the clock period is available for op amp settling. Therefore, it is generally necessary either to accept a lower sampling rate or to tolerate a higher noise level resulting from incomplete settling of the op amp, and consequent poorer performance.

Figure 4:
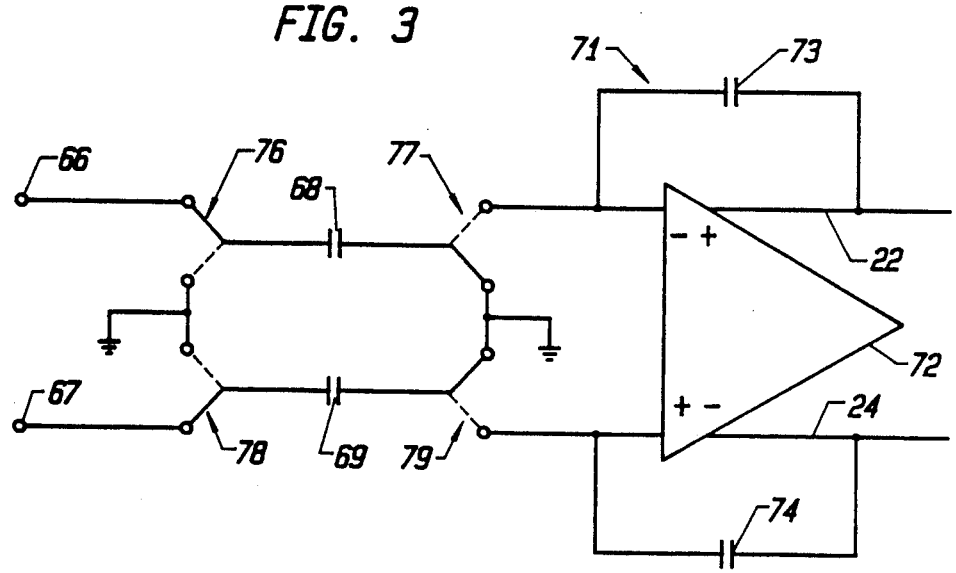
FIG. 4 is a schematic diagram of a differential switched-capacitor switch assembly of the type found in the prior art.

FIG. 3 shows a clock signal used for controlling the operation of the present modulator, and FIG. 4 shows a circuit schematic for a switched-capacitor configuration controlled by the clock signal of FIG. 3, but not employing the switching configuration of FIG. 1. The switching configuration of FIG. 4 includes input nodes 66 and 67, sampling capacitors 68 and 69, and the integrator circuit shown generally at reference numeral 71 and comprising differential operational amplifier 72 and integrating capacitors 73 and 74. The paired switches 76. 77 and 78. 79 switch the sampling capacitors 68 and 69 into and out of the signal paths. The switches 76–79 are operated in response to the clock signal of FIG. 3. A clock cycle of period T comprises the phases phi 1 and phi 2. In the phase phi 1 the switches 76 and 77 are disposed so as to interpose the sampling capacitor 68 between the input node 66 and ground. In this same phase the switches 78 and 79 are disposed so as to interpose the sampling capacitor 69 between the input node 67 and ground. Thus in phase phi 1 charge is allowed to accumulate on the sampling capacitors 68 and 69 in an amount representative of the signals applied to the input nodes 66 and 67 for the duration of phase 1. In phase 2 the switch pairs 76, 77 and 78, 79 are disposed so as to connect the sampling capacitors 68 and 69, respectively, between ground and the inputs of the integrating circuit 71. During phase 2 the amount of charge corresponding to the change of charge on the sampling capacitors between phase 2 and 1 will transferred to the top plates of the integrating capacitors and 74. The effect is to transfer charge to the integrating capacitors 73 and 74 in an amount determined by the change in sampled charge on the sampling capacitors from the previous phase. In its characteristic settling time the operational amplifier 72 will supply the same amount of charge, but of opposite polarity, to the bottom plates of the integrating capacitors 73 and 74. Disconnecting the sampling capacitors to the input of the operational amplifier before the op amp has fully settled results in incomplete charge transfer, thus increased noise at the outputs and, correspondingly, poorer performance. The result is that the duration of the clock phase phi 2 must be at least as long as the required op amp settling time if degradation in the signal-to-noise ratio is to be avoided.

The operation of the switching circuits in the present invention will now be explained with reference to FIGS. 1 and 2. The sampling capacitors 17 and 18 are switched back and forth between the respective signal paths once in each clock phase or, in other words, twice per clock cycle. In phase 1 of the clock cycle, sampling capacitor 17 is charged to a level representative of the signal at input node 10. At the same time, the charge corresponding to the voltage difference between the present voltage level at input node 10 and the voltage at input node 11 of the previous phase. i.e., phase 2 of the previous clock period, is transferred from sampling capacitor 17 to the integrator through the non-inverting input of the op amp. Similarly, in this same phase the signal at input node 11 is applied to sampling capacitor 18, and charge is transferred to the integrator through the inverting input 14 of the op amp.

During phase 2 of the clock signal, the sampling capacitors are "reversed," i.e., they are coupled between the opposite input nodes and amplifier inputs.

In this manner, the cross-coupled sampling switches 19–22 allow each phase to be used not only for sampling the two sides of the input signal, but also for transferring charge. This results in two signal transfers per clock period. Thus, for the same signal transfer rate, the clock frequency can be halved, resulting in a reduction of the op amp bandwidth requirement by a factor of two and concomitant improvement in the performance of the sigma-delta modulator. Using operational amplifiers having a settling time of 50 nanoseconds, the capacitors may be switched in a first-order signal processor responsive to a clock signal of 10 Megahertz to achieve an effective signal transfer rate of 20 Megahertz with good signal-to-quantization-noise characteristics. The same signal-to-noise requirements can be fulfilled with a second-order signal processor responsive to a clock signal of frequency somewhat greater than 1 Megahertz.

The configurations of the switches 41 and 42 function analogously to the switches 19–22 just described. These switches operate to provide a feedback reference voltage of either $((+Vref) - (-Vref))$ or $((-Vref) - (+Vref))$. depending upon the control signal from the A/D converter 33, i.e., depending upon the outcome of the decision reached by the converter 33 viewed as a logic device. For proper functioning of the invention, the decision-dependent feedback reference voltage must also be switched at the same effective rate as the main sampling switch arrangement 16. To accomplish this, the capacitors 36–39 form two pairs of interleaved sampling capacitors. See FIG. 1. The first pair of capacitors 36 and 37 provide the feedback voltage to the input of the op amp during phase 1, while the second pair 38 and 39 provide the feedback for phase 2. The additional controlled switch assemblies 41 and 42 operate to switch the capacitor bracketed between two such switch assemblies into the proper signal path. The switch assemblies 41 are responsive to the clock signal applied to control line 43. The switch assemblies 42 are responsive to the clock signal and additionally to the digital control signal from the A/D converter 33. These assemblies are switched between the bias voltage and one of the inputs of the op amp. The clock signal applied to control line 81 causes the assembly to switch between the switch node 82, connected to the bias voltage, and one of the switch nodes 83 or 84, connected to the inputs of the op amp. The additional control line 86 carries the decision-dependent control signal, which determines which of the nodes 83 or 84, hence, which op amp input, the respective capacitor is applied to. One skilled in the art can readily select standard integrated-circuit transistor switch assemblies to accomplish these switching functions.

The decision-responsive feedback means of FIG. 1 operates as follows. In phase 1, the charge corresponding to $((+Vref) - (-Vref))$ on capacitor 36 is transferred to either the positive or the negative op amp input depending on the prior decision, while the charge corresponding to $((-Vref - (+Vref))$ on capacitor 37 is transferred to the other op amp input. Similar operations occur during phase 2 except that the transfer of charge occurs from capacitors 38 and 39 to the integrator. Since one side of the capacitors 36–39 is switched between the bias voltage and one input of the op amp, the refreshing of op amp input bias is accomplished at the same time. This arrangement enables the op amp to have twice the settling time even in the situations where the feedback is decision dependent.

One skilled in the art will readily be able to implement the circuit designs disclosed herein in an integrated-circuit chip. Implementation in MOS or CMOS integrated circuitry is advantageous in that it is relatively easy to form capacitors and transistor switches. Implementation of specific transistor switch designs is well known and need not be disclosed further here.

While the above provides a full disclosure of illustrative embodiments of the invention, various modifications and equivalents will occur to those skilled in the art given the benefit of this disclosure. Accordingly, the invention is not intended to be limited only to the specific examples and embodiments disclosed herein, but is to be defined by the appended claims.

What is claimed is:

1. A sigma-delta signal processor for use in processing a voiceband or higher-frequency differential input signal having first and second polarities, comprising:
   first and second input nodes for receiving said input signal polarities;
   a differential amplifier integrator having first and second inputs associated with said first and second input nodes, respectively, to define first and second signal paths for integrating the first and second polarities of said input signal;
   first and second sampling capacitors interposed in said signal paths between said associated input nodes and amplifier inputs:
   first controllable switch means responsive to a first control signal for alternately and concurrently coupling said first and second sampling capacitors into opposite signal paths for providing a sampled signal to said amplifier inputs at a characteristic signal transfer rate;
   means responsive to the output signal from said integrator for providing a second, digital control signal having a predetermined number of bits for characterizing said output signal;
   a D/A converter for converting said second digital control signal to a feedback signal applied in negative feedback relation to said amplifier inputs, said converter comprising:
      an assembly of paired feedback capacitors for accumulating opposite charge levels on the capacitors of respective pairs in amounts determinative of predetermined values of said feedback signal; and
      second controllable switch means responsive to said first control signal for alternately and concurrently charging the capacitors of said respective pairs to said opposite charge levels, said second switch means being structured and arranged to provide said feedback signal at a rate commensurate with said characteristic signal transfer rate, and said second switch means being responsive to said second digital control signal for selectively coupling said charged capacitors to said first and second amplifier inputs so as to apply a selected feedback value to a selected input.

2. The apparatus of claim 1 wherein said first and second controllable switch means comprise a plurality of integrated-circuit transistor switches gated responsive to a common first control signal.

3. The apparatus of claim 2 wherein said first control signal is provided by a two phase lock characteristic frequency, and said first and second controllable switch means are alternately switched responsive to the two phases of said clock signal.

4. The apparatus of claim 3 wherein said characteristic clock frequency is at least 9 Megahertz.

5. The apparatus of claim 1 wherein
   said second control signal is a one-bit signal indicating the polarity of said integrator output signal, and
   said second controllable switch means charges the capacitors of said respective pairs to two opposite charge levels and selectively applies said feedback signal to said first or second amplifier input according to the bit value of said one-bit signal.

6. The apparatus of claim 5 wherein said first and second controllable switch means comprise a plurality of integrated-circuit transistor switches gated responsive to a common first control signal, said first control signal being provided by a two phase clock signal of frequency at least 1 Megahertz and said switch means are alternately switched responsive to the two phases of said clock signal.

7. A high-speed sigma-delta signal processor for use in processing a voiceband or higher-frequency differential input signal having first and second polarities, comprising:
   first and second input nodes for receiving said input signal polarities;
   a differential amplifier integrator having first and second inputs associated with said first and second input nodes, respectively, to define first and second signal paths for integrating the first and second polarities of said input signal;
   first and second sampling capacitors;
   first controllable transistor switch means for alternately and concurrently switching said first and second sampling capacitors into respective signal paths, said switch means having two switch states, wherein
      in a first state, said first and second sampling capacitors are interposed between said first input node and said first integrator input and between said second input node and said second integrator input, respectively, so as to sample said first and second polarities of said input signal, respectively;
      in a second state, said first and second sampling capacitors are interposed between said second input node and said second integrator input and between said first input node and said first integrator input, respectively, so as to sample said second and first polarities of said input signal, respectively; and
      said switch means is switchable between said first and second states responsive to a clock signal of characteristic clock frequency, whereby both sides of said differential input signal are sampled and integrated at an effective signal transfer rate of at least twice said characteristic clock frequency;
   means responsive to the output signal from said integrator for providing a one-bit digital control signal, said one bit indicating the polarity of said output signal;
   a D/A converter for converting said one-bit control signal to a feedback signal applied in negative feedback relation to said integrator inputs, said converter comprising:

first and second pairs of feedback capacitors for accumulating opposite charge levels on the capacitors of respective pairs in amounts determinative of two predetermined feedback signal values; and second controllable transistor switch means responsive to said clock signal for alternately and concurrently charging the capacitors of each said pair to said opposite charge levels, said second switch means being structured and arranged to provide said feedback signal at said characteristic clock frequency, and said second switch means selectively applying a selected feedback value to said first or second amplifier input according to the bit value of said one-bit control signal.

8. A high-speed second-order sigma-delta signal processor for use in processing a voiceband or higher-frequency differential input signal having first and second polarities, comprising:

first and second stages, each said stage comprising:

first and second input nodes for receiving a respective input signal to the respective stage;

a differential amplifier integrator having first and second inputs associated with said first and second input nodes respectively, to define first and second signal paths for integrating the first and second polarities of said respective input signal;

first and second sampling capacitors;

first controllable transistor switch means for alternately and concurrently switching said first and second sampling capacitors into respective signal paths, said switch means having two switch states, wherein in a first state, said first and second sampling capacitors are interposed between said first input node and said first integrator input and between said second input node and said second integrator input, respectively, so as to sample said first and second polarities of said respective input signal;

in a second state, said first and second sampling capacitors are interposed between said second input node and said second integrator input and between said first input node and said first integrator input, respectively, so as to sample said second and first polarities of said respective input signal; and said switch means is switchable between said first and second states responsive to a clock signal of characteristic clock frequency, whereby both sides of said respective input signal are sampled and integrated at an effective signal transfer rate of at least twice said characteristic clock frequency; and a D/A converter for converting a digital control signal to a feedback signal applied in negative feedback relation to said amplifier inputs, said converter comprising:

an assembly of paired feedback capacitors for accumulating opposite charge levels on the capacitors of respective pairs in amounts determinative of predetermined values of said feedback signal; and second controllable switch means responsive to said clock signal for alternately and concurrently charging the capacitors of said respective pairs to said opposite charge levels, said second switch means being structured and arranged to provide said feedback signal at a rate commensurate with said effective signal transfer rate, and said second switch means being responsive to said digital control signal for selectively coupling said charged capacitors to said first and second amplifier inputs so as to apply a selected feedback value to a selected input; and means responsive to the output signal from the integrator of said second stage for providing said digital control signal, said control signal being formed with a predetermined number of bits characterizing said second-stage integrator output signal, the bit values of which correspond to the predetermined values of said feedback signal.

9. The apparatus of claim 8, wherein said characteristic clock frequency is at least 1 Megahertz and said differential amplifiers have a characteristic settling time of at most 1 microsecond.

10. The apparatus of claim 9 wherein said assembly of feedback capacitors comprises first and second pairs of capacitors;

said digital control signal is a one-bit signal indicating the polarity of said second-stage integrator output signal, and said second controllable switch means charges the capacitors of said first and second pairs to two opposite charge levels determinative of two predetermined feedback signal values and selectively applies a feedback value to said first or second amplifier input according to the bit value of said one-bit signal.

* * * * *